United States Patent [19]

Pierfederici

[11] 4,304,983

[45] Dec. 8, 1981

[54] PLASMA ETCHING DEVICE AND PROCESS

[75] Inventor: Alfred J. Pierfederici, Raritan, N.J.

[73] Assignee: RCA Corporation, New York, N.Y.

[21] Appl. No.: 163,148

[22] Filed: Jun. 26, 1980

[51] Int. Cl.³ .............................................. B23K 7/00
[52] U.S. Cl. ..................... 219/121 PG; 219/121 PD; 219/121 PE; 204/192 E; 204/298; 156/646; 250/539
[58] Field of Search ................. 219/121 PD, 121 PF, 219/121 PG, 121 PE, 121 P; 204/192 E, 298; 156/643, 646, 345; 250/531, 535, 539

[56] References Cited

U.S. PATENT DOCUMENTS

| | | | |
|---|---|---|---|
| 1,926,473 | 9/1933 | Wood | 219/365 |
| 3,879,597 | 4/1975 | Bersin et al. | 219/121 PD |
| 4,115,184 | 9/1978 | Poulsen | 204/192 E |
| 4,147,564 | 4/1979 | Magee et al. | 156/643 |
| 4,151,064 | 4/1979 | Kuehnle | 204/298 |
| 4,160,690 | 7/1979 | Shibagaki et al. | 204/192 E |

Primary Examiner—Gene Z. Rubinson
Assistant Examiner—M. Paschall
Attorney, Agent, or Firm—Birgit E. Morris; Donald S. Cohen; Joseph D. Lazar

[57] ABSTRACT

A plasma etching device having a quartz cylinder surrounded by RF energized electrodes or coils, contains a slotted aluminum tube into which wafers for etching are supported and processed. Each of the slots of the aluminum tube is provided with a shield extending longitudinally of the slot to intercept optical radiation, including deleterious ultraviolet (UV) radiation, of the plasma from entering the tube while still permitting the active etchant particles to pass into the tube to act on the wafers.

8 Claims, 2 Drawing Figures

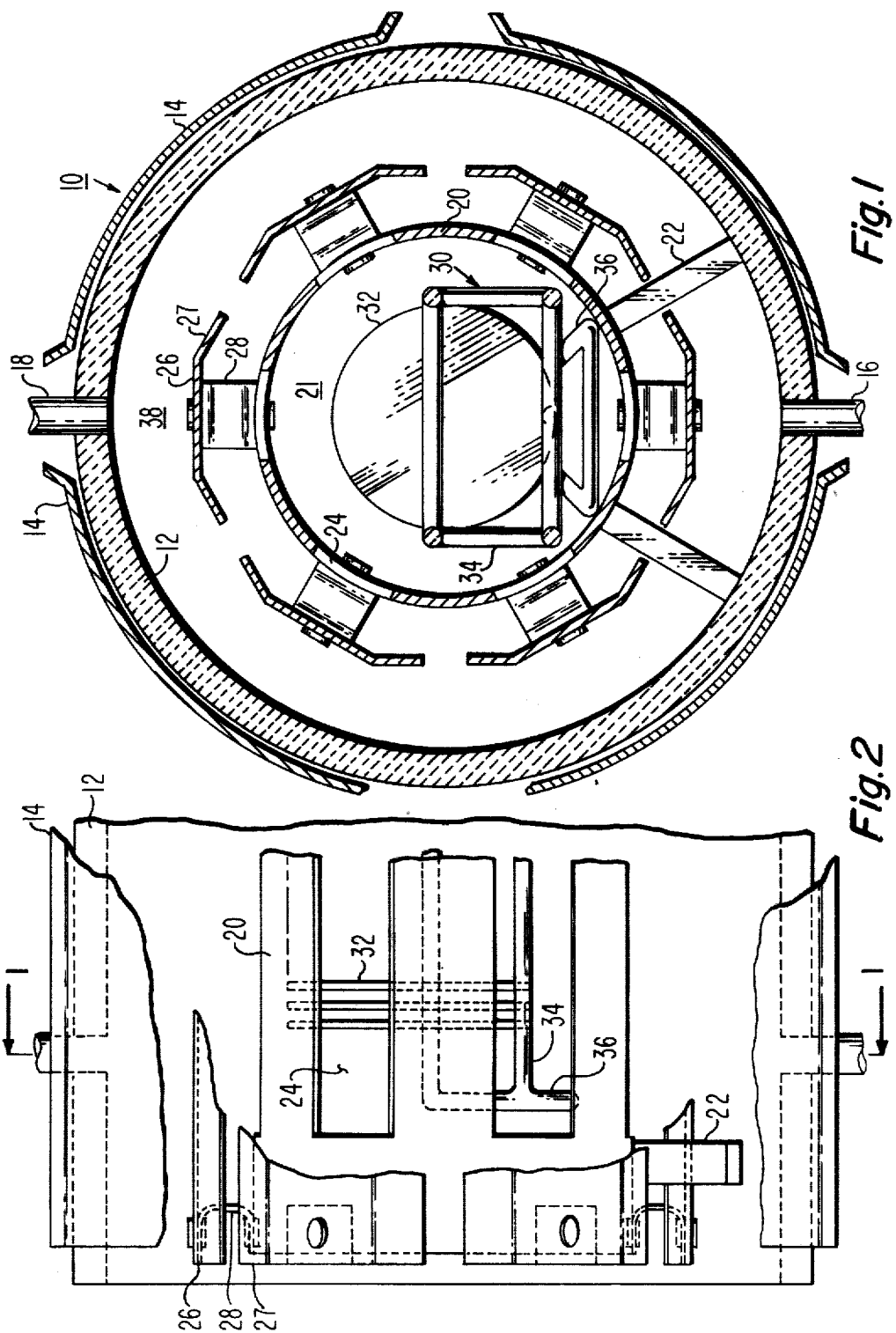

4,304,983

PLASMA ETCHING DEVICE AND PROCESS

BACKGROUND OF THE INVENTION

This invention relates to plasma etching devices of the type using radio frequency energy to provide a plasma for the etching vapor.

Plasma etching devices are well-known. They provide a means for etching with plasma materials that otherwise are etched by processes involving deposition of etching materials in liquid form. U.S. Pat. No. 3,879,597 issued to Bersin et al., on Apr. 22, 1975 describes a plasma etching device that develops a plasma of the etchant that achieves uniform etching and does so in a rapid and effective manner. However, the plasma generated by the RF energy surrounding the wafer material to be processed causes a harmful plasma manifested as a blue haze whose ultraviolet (UV) radiation often damages the wafers and thereby reduces the yield of the device being processed. There is a need in the field for a system of that type that reduces and inhibits the deleterious radiation effects developed by the plasma.

SUMMARY OF THE INVENTION

According to the present invention, a plasma etching device is provided with a reaction chamber formed suitably of aluminum and provided with at least one opening but preferably several longitudinally-extending slots located in separated positions around the periphery of the chamber. A shield extending longitudinally over the opening of the slot is provided on the outer periphery of the chamber in such a position as to shield the ultraviolet radiation from passing into the chamber.

BRIEF DESCRIPTION OF THE DRAWING

In the drawing:

FIG. 1 is a sectional end view of one form of the apparatus according to the invention, and FIG. 2 is a cross section of the apparatus shown in FIG. 1 along viewing line 1—1.

DETAILED DESCRIPTION OF A PREFERRED EMBODIMENT

The device 10 includes a cylindrical chamber 12 which is formed of an inorganic material such as quartz. Surrounding the chamber 10 are electrodes 14 suitable in the form of a single coil or a number of electrodes. The electrodes 14 are connected to a source of electrical energy at radio frequency (RF) in any suitable circuit configuration known in the art. The cylindrical chamber 12 is moreover provided with a gas inlet 16 and a gas outlet 18 which is connected to a suitable apparatus for evacuating the chamber 12. An electrically conductive metallic cylinder 20 is supported within the chamber 12 by suitable legs 22 formed preferably of quartz or any other suitable ceramic material. The cylinder 20 is provided with a plurality of slots 24 suitably distributed about the circumference of the cylinder 20 and extending substantially along the entire length of the cylinder. A shield 26 is positioned over each slot 27. A flexible metallic support bracket 28 is connected at each end of the shield 26 and to the outer surface of the cylinder 20 to support the shield 26 in the desired fixed position. Bracket 28 is suitably C-shaped and easily bent to adjust the spacing between the shield and the slot opening. Preferably a wing member 27 is provided along each edge of each shield 26 and arranged to extend downwardly toward the cylinder 20 to provide an angulated shield to optical radiation which may be inclined at a low angle toward the slot 24. Whether or not a wing member 27 is provided on the shield 26, the shield 26 serves to prevent optical radiation from passing into region 21 of the cylinder 20. The shield 26 is spaced furthermore from the slot 24 to allow a proper flow pattern of the etchant gas into the cylinder 20 sufficient to etch a target wafer 32.

Within the cylinder 20 support means 30 are provided to carry wafers 32 within the cylinder 20 comprising, for example, a rack or boat 34 having skids or wheels 36. The material to be etched does not form a part of this invention but is illustrated to show the positional relationships of the plasma etched device of the invention as it will be used in practice.

The device 10 is provided with conventional control equipment, including a temperature sensor, to control the flow of etchant gas into the chamber 12.

In operation, the device 10 of the invention is employed by positioning one or more wafers 30 in the rack 24 so that they are evenly spaced between the front and rear walls (not shown) of the chamber 12 and approximately coaxial with the chanber. When the wafers 32 are in position, the front opening is closed, and the chamber 12 is evacuated to very low pressures in the range such as 0.1 to 20 torr. It is generally desirable to bleed some of the plasma producing gas, such as tetrafluoro methane ($CF_4$) containing 4% oxygen, into the chamber and to evacuate it again so that by dilution air is removed almost completely in a manner well-known in the art. Radio frequency voltage is applied to the electrodes 14 causing a brilliant glow (blue haze) to develop in the space between the cyliner 20 and the inner surface of the chamber 12. The plasma glow in the annular space 38 is caused by the excitation of the etchant gas. The plasma contains ions, free electrons, ultraviolet radiation, strong electric fields, and free radicals. The plasmas are preferably generated at low pressures in the order of 0.1 to 20 torr. If oxygen alone is used as the etchant gas, the glow is in the form of a red haze. Other forms of plasma etching gases may be used as known in the art.

The shields 26 positioned above the slots 24 serve as an optical filter to prevent the optical ultraviolet (UV) radiations of the plasma from passing into the chamber 30. Accordingly, the shields 26 including the wing members 27 are positioned to prevent the UV radiation from entering the interior region 21 of cylinder 20 by being spaced sufficiently close to the slot 24. However, the shield should not be so close to the slot 24 as to close off the slot and prevent the free passage of the reactant gases from passing into the chamber 30. It should be understood that the shields 26 serving as optical filters of the harmful optical components of the plasma should still allow the reactant components of the plasma, particularly the free radicals generated by the RF reaction with $CF_4$, to be drawn into the region 21. A substantial portion of the reactant etchant material of the plasma passes into the reaction chamber 30 and is drawn therefrom through exit passage 18 suitably connected to a vacuum means. During the operation of the device, the interior of the cylinder 20 remains dark indicating, in general, the absence of ultraviolet radiations. However, the absence of the characteristic plasma glow (blue haze in this example) does not necessarily mean the absence of ultraviolet radiation. Since ultraviolet radiations are not visible, the operating conditions of gas pressure, RF voltage, etc., can change the plasma appearance. However, the ultraviolet radiation caused by the reaction of the RF field on the etchant gas in the region 38 will enter the region 21 through the slots 24 unless prevented from doing so. The field 26, properly positioned over the slot 24, will prevent such UV radiation from entering the region 21.

In one particular design, the cyliner 20 is formed of aluminum 1/16" (1.58 mm) thick having an inside diameter of 5¼" (13.3 cm) and an overall length of 15" (38.1 cm). Six slots are provided in the wall of the aluminum cylinder each being 12" (30.48 cm) long and 1¼" (3.17 cm) wide. The shields 26 are formed of aluminum 1/16" (1.58 mm) thick having wing members 27 of about ½" (12.7 mm) at about a 30° angle from the shield plane. The shields 26 are positioned over the slots 24 with a spacing of about ⅝" (15.8 mm). A C-shaped adjustable flexible support bracket 28 is attached to either end of the shield 26 and connected to the wall of the cylinder 20 in such a manner to allow for an adjustment in the spacing of the shields 26 over the slots 24 between ⅜ to 1 inch (9.52 to 25.4 mm).

In operation a device made according to the principles of this invention, provided plasma stripping of photoresist on wafers that was comparable to that provided by the so-called wet chemical etching processes. Furthermore, the deleterious effects on the wafers caused by ultraviolet radiation from the plasma that otherwise would be within the reaction chamber 30 was virtually eliminated by the optical shield mechanism (26,27).

The invention may be used in systems requiring different size wafers or other devices to be etched by providing proportionally different dimensions for slots and the shields than those described above according to the dimensions of the reaction chamber desired.

In prior art plasma etch apparatus such as that disclosed in the aforementioned U.S. Pat. No. 3,879,597, the reaction chamber in which the wafer to be etched is not shielded from the harmful ultraviolet radiations formed as part of the plasma. Accordingly, whatever the intensity of the plasma generated by the radio frequency excitation voltage, the ultraviolet radiation still exists and will pass into the etchant reaction portion of the system as long as there is an optical path to follow.

The present invention substantially eliminates the optical path into the chamber and thereby eliminates the harmful effects of ultraviolet radiation.

What is claimed is:

1. In a plasma etching device comprising a non-metallic, inorganic, hollow chamber having an end wall, an inner wall and an opposing front opening, and means for generating RF energy disposed about the inorganic chamber, wherein the improvement comprises:

a chamber of electrically conductive unperforated sheet of metal, except for at least one certain opening to pass sufficient reactant gas therethrough, said conductive chamber being positioned within and, spaced from the inner wall of the inorganic chamber, the conductive chamber being sufficiently large in diameter to contain the material to be etched, and a member extending over the certain opening and spaced from the certain opening to provide a gap between the member and the certain opening serving to shield optical radiations from flowing through the certain opening.

2. In the device according to claim 1, wherein the inner conductive chamber is concentrically positioned within the outer chamber.

3. In the device according to claim 2, wherein the certain opening is in the form of an elongated slot extending lengthwise of the conductive chamber and having a width sufficient to pass reactant gas.

4. In the device according to claim 1, wherein the members are generally planar supported with means to provide for a predetermined spacing of each planar member over the corresponding slot.

5. In the device according to claim 4, wherein the support means is adjustable.

6. In the device according to claim 5, wherein the adjustable support means is a c-shaped flexible member connected to the member and the conductive chamber.

7. In the device according to claim 2, wherein said inorganic chamber is a cylinder formed of quartz and said conductive chamber is a cylinder formed of aluminum.

8. In the device according to claim 7, wherein said shield member is formed of aluminum.

* * * * *